United States Patent
Petrov et al.

(10) Patent No.: US 7,317,606 B2
(45) Date of Patent: Jan. 8, 2008

(54) PARTICLE TRAP FOR ELECTROSTATIC CHUCK

(75) Inventors: Igor Petrov, Holon (IL); Igor Krivts (Krayvitz), Rehovot (IL); Eitan Kidron, Hod Hasharon (IL); Guy Eitan, Kfar HaOranim (IL); Igal Ben-Dayan, D.N. Negev (IL)

(73) Assignee: Applied Materials, Israel, Ltd., Rehovot (IL)

( * ) Notice: Subject to any disclaimer, the term of this patent is extended or adjusted under 35 U.S.C. 154(b) by 164 days.

(21) Appl. No.: 11/119,316

(22) Filed: Apr. 28, 2005

(65) Prior Publication Data

US 2006/0126261 A1    Jun. 15, 2006

Related U.S. Application Data

(60) Provisional application No. 60/634,903, filed on Dec. 10, 2004.

(51) Int. Cl.
*H02N 13/00* (2006.01)

(52) U.S. Cl. ........................................ 361/234

(58) Field of Classification Search ................ 361/234
See application file for complete search history.

(56) References Cited

U.S. PATENT DOCUMENTS

| | | | |
|---|---|---|---|
| 6,169,652 B1 * | 1/2001 | Klebanoff | 361/234 |
| 6,380,546 B1 | 4/2002 | Petrov et al. | |
| 6,451,176 B1 * | 9/2002 | Vernon et al. | 204/192.11 |
| 6,534,775 B1 * | 3/2003 | Harrington et al. | 250/492.21 |
| 6,674,075 B2 | 1/2004 | Petrov et al. | |
| 6,689,930 B1 | 2/2004 | Pang et al. | |
| 6,825,475 B2 | 11/2004 | Petrov et al. | |

* cited by examiner

*Primary Examiner*—Ronald W. Leja
(74) *Attorney, Agent, or Firm*—Tarek N. Fahmi

(57) ABSTRACT

Wafer supporting apparatus, including an electrostatic chuck for supporting the wafer. The apparatus further includes an electrostatic shield which is positioned in proximity to the chuck and the wafer, and a voltage source which is coupled to apply an electric field between the chuck and the wafer. The voltage source applies one or more potentials to the electrostatic shield so as to prevent penetration of particles to the wafer.

8 Claims, 2 Drawing Sheets

PARTICLE TRAP FOR ELECTROSTATIC CHUCK

CROSS-REFERENCE TO RELATED APPLICATION

This application claims the benefit of U.S. Provisional Patent Application 60/634,903, filed 10 Dec. 2004, which is incorporated herein by reference.

FIELD OF THE INVENTION

The present invention relates generally to reducing contamination in semiconductor fabrication, and particularly to reducing the contamination by electrostatic means.

BACKGROUND OF THE INVENTION

A basic goal of a wafer fabrication plant is reduction of particulate contamination, and one of the times at which this type of contamination needs to be kept as small as possible is when the wafer is being inspected or examined, using a scanning electron microscope (SEM) or microscope that uses other investigative charged particles such as gallium ions. Since the microscope operates under high vacuum, the evacuation of the microscope of itself reduces contamination by unwanted particles. However, the evacuating system may introduce unwanted particles, and/or the charged particles used by the microscope may also introduce unwanted particles, as is exemplified by the following prior art.

U.S. Pat. No. 6,534,775 to Harrington, et al., whose disclosure is incorporated herein by reference, describes a system and method for inhibiting the transport of particles entrained in an ion beam. The particles within the beam are charged to a polarity in a first region, and a first electric field diverts the charged particles. An electrode downstream from the first electric field provides a potential barrier which repels the charged particles. As a result, the charged particles may be directed away from the direction of beam travel, out of the ion beam, thereby mitigating contamination of a workpiece.

U.S. Pat. No. 6,689,930 to Pang, et al., whose disclosure is incorporated herein by reference, describes a system for eliminating contaminants and residues from inside a vacuum exhaust line connected to a processing chamber. Powder residue and other particulate matter that would otherwise collect in the vacuum line during deposition steps are trapped in a collection chamber and removed through a plasma formed downstream of the reaction chamber.

One of the means of support for the wafer in an SEM or other charged particle microscope is an electrostatic chuck. Electrostatic chucks operate by supporting the wafer mechanically at a number of points beneath the wafer, while using these points to also impart a charge to the wafer. Forces on different portions of the charged wafer may be generated by applying respective electric fields to these portions, using an electrode incorporated in the chuck. The electric fields allow, for example, forces of gravity which may locally bend the wafer to be compensated for.

U.S. Pat. No. 6,451,176 to Vernon, et al., whose disclosure is incorporated herein by reference, describes interception and trapping of charged particulate matter generated by ion beam sputter deposition. An electrostatic particle trap generates electrostatic fields in the vicinity of a substrate on which target material is being deposited. The electrostatic particle trap consists of an array of electrode surfaces, each maintained at an electrostatic potential, having their surfaces parallel or perpendicular to the surface of the substrate.

SUMMARY OF THE INVENTION

In embodiments of the present invention, an electrostatic shield is positioned in proximity to an electrostatic chuck. A voltage source is coupled to the chuck, and generates a first electric field between the chuck and the wafer for supporting the wafer. The voltage source is also coupled to apply one or more potentials to the shield, generating a second electric field that acts as a guard field preventing particles penetrating to the wafer. Using a guard field significantly reduces contamination caused by unwanted particles being attracted to the wafer, typically particles which are on internal surfaces of an evacuated container holding the chuck and wafer. Without the guard field, these unwanted particles would be attracted to the wafer by the first electric field.

Typically, the shield comprises two or more electrodes which are electrically isolated from the chuck and wafer. One electrode, typically in the form of a disc with an aperture, may be positioned above the wafer. The aperture allows access to the wafer for charged particles, such as electrons and/or ions, that are used to investigate the wafer. A second electrode may be positioned beneath the chuck. A third electrode may be used to receive the unwanted particles. A different potential may be applied to each electrode, so as to adjust the guard field to minimize unwanted particle penetration to the wafer.

The present invention will be more fully understood from the following detailed description of the embodiments thereof, taken together with the drawings, a brief description of which follows.

DETAILED DESCRIPTION OF EMBODIMENTS

Figure 1:
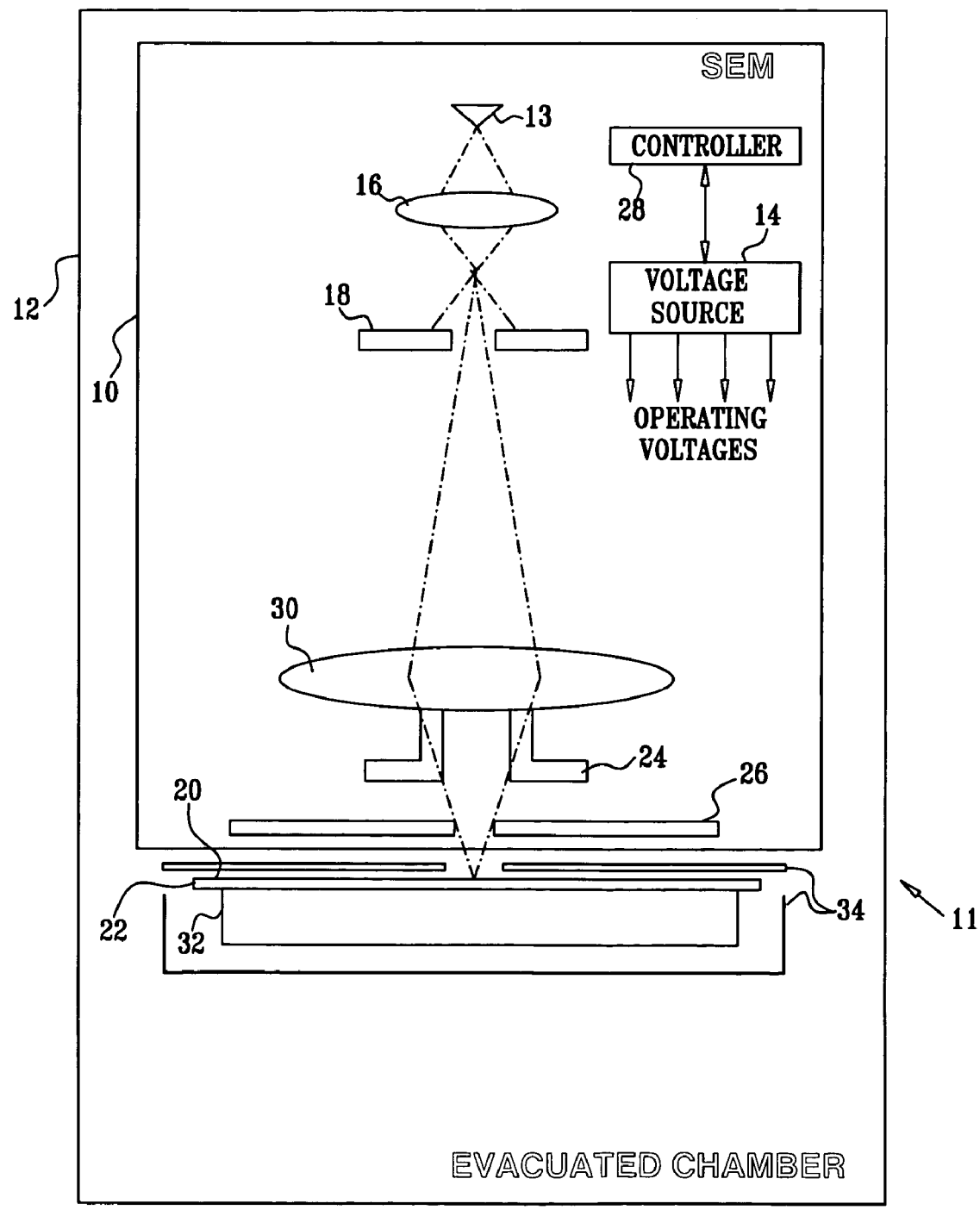
FIG. 1 is a schematic diagram of a wafer investigation system, according to an embodiment of the present invention.

Reference is now made to FIG. 1, which is a schematic diagram of a wafer investigation system 11, according to an embodiment of the present invention. System 11 comprises a scanning electron microscope (SEM) 10 which is enclosed by, and operates in, an evacuated chamber 12; for clarity, details of the evacuation machinery and couplings operating the chamber are not shown in FIG. 1. A controller 28 operates a voltage source 14 which supplies voltages to elements of system 11, as described in more detail below. Controller 28 also operates the SEM. SEM 10 comprises a cathode 13 which generates electrons that are typically used to investigate one or more properties or characteristics of a wafer 22. While the description herein assumes that wafer 22 is investigated using electrons generated in an SEM, it will be understood that the scope of the present invention includes other investigative particles and/or other apparatus that may be used to irradiate objects such as wafer 22. Such particles and apparatus include, but are not limited to, ions in a focused ion beam system such as a gallium implantation facility.

For clarity, elements positioned in relation to wafer 22 are described assuming that the wafer 22 is generally horizontal, but it will be understood that the scope of the present invention is not limited to any particular orientation of the wafer or of elements positioned in relation to the wafer.

The electrons from cathode 13 are focused by a first condenser 16. Condenser 16 typically comprises one or more electrostatic and/or magnetic elements that are arranged to focus incoming electrons, by methods which will be apparent to those skilled in the art, and which receive their operating voltages from source 14. The focused electrons traverse an aperture 18, which acts as an iris allowing electrons to penetrate through a central opening of the iris.

The electrons passing through aperture 18 are focused to a surface 20 of wafer 22, and are typically used to investigate surface and sub-surface features of the wafer, using processes that are well known in the art. The focusing is provided by an objective lens 30, typically a magnetic objective lens, and an electrostatic retarding lens comprising an anode 24, a cap electrode 26, and surface 20 of the wafer. Wafer 22 is supported by an electrostatic chuck 32, and the wafer and the chuck are surrounded by a conductive shield 34.

Figure 2:
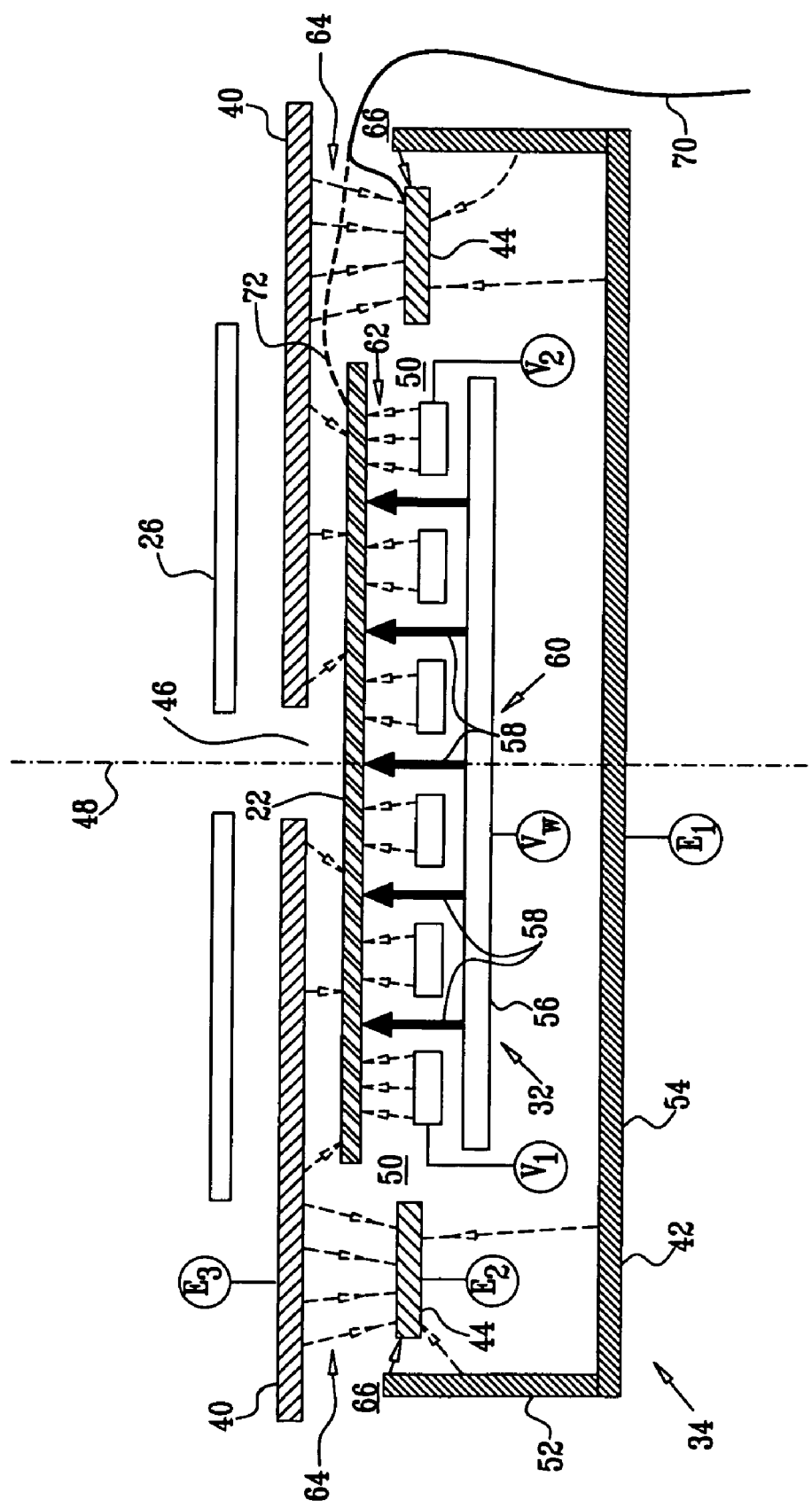
FIG. 2 is a schematic sectional diagram of a conductive shield, a wafer, and an electrostatic chuck operative in the system of FIG. 1, according to an embodiment of the present invention.

FIG. 2 is a schematic sectional diagram of shield 34, wafer 22, and chuck 32, according to an embodiment of the present invention. Shield 34 comprises three electrodes, an upper electrode 40, a lower electrode 42, and an internal electrode 44. Typically, all the electrodes are circular in form and have a common axis of symmetry 48, orthogonal to wafer 22. Upper electrode 40 is disc-shaped, having an aperture 46 allowing passage for electrons from SEM 10, as well as for secondary electrons that may be generated at the wafer surface. The upper electrode is positioned between wafer 22 and cap electrode 26 of SEM 10. Internal electrode 44 is also disc-shaped, having an aperture 50 that accommodates chuck 32. Lower electrode 42 is generally cup-shaped, being formed from a generally vertical circular wall 52 that is coupled to a generally planar base 54. Lower electrode 42 is configured to surround internal electrode 44 and a lower portion of chuck 32, and there is an opening 66 between the lower electrode and the upper electrode. Opening 66 is sufficiently large so that no arcing occurs between the electrodes.

The positions of the electrodes of shield 34 relative to each other are typically maintained in a substantially fixed relation by insulating supports. Similarly, the position of shield 34 relative to chuck 32 (described in more detail below) may be maintained in a relatively fixed relation by insulating supports. Typically, the combined chuck and shield are attached to a vertical translation stage, which enables the height of the wafer to be adjusted relative to SEM 10. For clarity, neither sets of supports nor the translation stage are shown in FIG. 2.

Chuck 32 is formed of a lower chuck electrode 56 which has a number of conductive pins 58 that are generally orthogonal to electrode 56. Pins 58 support wafer 22, and also provide a conductive path between electrode 56 and the wafer. Chuck 32 also comprises an array of upper electrode elements 60, positioned between the wafer and the lower electrode, and having apertures between the elements that permit pins 58 to pass therebetween without contacting the elements. The apertures are sufficiently large so that no arcing occurs across the apertures.

Elements 60 comprise two sub-arrays which are insulated from each other. Controller 28 operates source 14 to apply a potential $V_w$ to the lower chuck electrode, and potentials $V_1$ and $V_2$ to the respective sub-arrays of elements 60. The controller typically sets the values of the potentials so that an electric field that they generate, shown schematically as broken lines 62, helps support wafer 22 and ensures that the surface of the wafer is as flat as possible by generating a generally planar equipotential surface at the wafer. The electric field also enhances the chucking force. Typical values for $V_w$, $V_1$, and $V_2$ are approximately −3000V, −2400V, and −3600V respectively.

Controller 28 also operates source 14 to apply potentials $E_1$, $E_2$, and $E_3$ respectively to lower electrode 42, internal electrode 44, and upper electrode 40. The controller chooses the potentials so that, taken together with the potentials used for $V_w$, $V_1$, and $V_2$, they generate a guard electric field 64 which surrounds wafer 22. The guard field is shown schematically as broken lines. Typical values for potentials $E_1$, $E_2$, and $E_3$ are approximately 0V, in a range from approximately −3000V to approximately −5000V, and 0V respectively.

Guard field 64 acts to prevent both charged and uncharged particles, which may be present in chamber 12, from penetrating via opening 66 of shield 34 to wafer 22. In the absence of the shield, such particles would typically be attracted to the wafer, since the wafer is charged, in the example above to a potential of −3000V. Even in the case that the wafer is uncharged, the electric field generated by chuck 32 acts to attract both charged and uncharged particles. Shield 34 prevents such particles from reaching the wafer, typically by guard field 64 diverting the particles to internal electrode 44 of the shield, so that electrode 44 acts as a particle receiving electrode. A typical path of a diverted particle is shown as a solid line 70, and for comparison, the path that would be taken by the particle in the absence of shield 34 is shown as a broken line 72.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. Wafer supporting apparatus, comprising:
   an electrostatic chuck for supporting the wafer;
   an electrostatic shield which is positioned in proximity to the chuck and the wafer, the electrostatic shield having multiple electrodes, a first one of which is positioned above the electrostatic chuck, a second one of which is configured and positioned to accommodate the chuck, and a third one of which is configured and positioned to surround the second electrode and the chuck; and
   a voltage source which is coupled to apply an electric field between the chuck and the wafer, and to apply one or more potentials to the electrostatic shield so as to prevent penetration of particles to the wafer.

2. The apparatus according to claim 1, wherein the electrodes of the electrostatic shield are coupled respectively to the one or more potentials so as to generate a guard field around the wafer.

3. The apparatus according to claim 1, wherein the second one of the electrodes of the electrostatic shield comprises an electrode which receives the particles.

4. The apparatus according to claim 1, wherein the first one of the electrodes of the electrostatic shield includes an aperture allowing passage of investigative particles for inspection of the wafer.

5. The apparatus according to claim 1, wherein the electric field acts to attract the particles to the wafer, and wherein the one or more potentials generate a guard field which counteracts the attraction.

6. A method for supporting a wafer, comprising:
positioning the wafer in an electrostatic chuck;
positioning a multi-electrode electrostatic shield in proximity to the electrostatic chuck and the wafer;
applying an electric field between the chuck and the wafer; and
applying different potentials to each electrode of the electrostatic shield so as to prevent penetration of particles to the wafer and to assist in supporting the wafer in the electrostatic chuck.

7. The method according to claim 6, wherein one of the electrodes of the electrostatic shield includes an aperture, and further comprising allowing passage of investigative particles for inspection of the wafer through the aperture.

8. The method according to claim 6, wherein the electric field acts to attract the particles to the wafer, and wherein the different potentials generate a guard field which counteracts the attraction.

* * * * *